United States Patent [19]

Elles et al.

[11] 4,422,568
[45] Dec. 27, 1983

[54] METHOD OF MAKING CONSTANT BONDING WIRE TAIL LENGTHS

[75] Inventors: Richard J. Elles, Philadelphia; Razon Ely, Hatboro; Dan Vilenski, Horsham, all of Pa.

[73] Assignee: Kulicke and Soffa Industries, Inc., Horsham, Pa.

[21] Appl. No.: 224,099

[22] Filed: Jan. 12, 1981

[51] Int. Cl.³ .................................................. B23K 1/06
[52] U.S. Cl. ..................................... 228/111; 228/179
[58] Field of Search ................. 228/4.5, 110, 111, 179

[56] References Cited

U.S. PATENT DOCUMENTS

| | | | |
|---|---|---|---|
| 3,444,612 | 5/1969 | Pennings | 228/110 |
| 3,460,238 | 8/1969 | Christy | 228/111 |
| 3,623,649 | 11/1971 | Keisling | 228/4.5 |
| 3,643,321 | 2/1972 | Field | 228/179 |
| 3,747,198 | 7/1973 | Benson | 228/111 |
| 4,239,144 | 12/1980 | Elles | 228/4.5 |
| 4,266,710 | 5/1981 | Bilane | 228/4.5 |

OTHER PUBLICATIONS

*Model 1470 Automatic Wire Bonder,* Kulicke & Soffa Industries, Inc.
SAE Product Bull., *Model 484,* Kulicke & Soffa Industries, Inc.

Primary Examiner—Nicholas P. Godici
Assistant Examiner—Marc Hodak
Attorney, Agent, or Firm—John B. Sowell

[57] ABSTRACT

In a high speed automatic fine wire bonding machine of the type adapted to produce a wire interconnection between two bonding points on a semiconductor device there is provided a method of making consistent, exact predetermined lengths of wire under the working face of a bonding tool after a second bond is finished and in preparation for making the next first bond of a wire interconnection.

8 Claims, 10 Drawing Figures

METHOD OF MAKING CONSTANT BONDING WIRE TAIL LENGTHS

BACKGROUND OF THE INVENTION

1. Field of the Invention

The present invention is related to fine wire bonding and the operation of automatic wire bonding machines. More particularly, the present invention is related to a novel method of forming the bonding wire tail under the working face of the fine wire bonding wedge after making a second bond and in preparation for making another first bond.

2. Description of the Prior Art

Fine wire bonding machines are known and were introduced at the time of commercial production of semiconductor devices. Discrete transistor elements in the early 1960's employed fine gold or aluminum wire as connections between electrode pads on the semiconductor chip and a post or lead out pin. Various methods have been employed to separate the wire from the second bonding point after the second bond is made so that the same length of wire is eventually positioned under the working face of the bonding wedge and is ready for making the first bond of a two bond wire interconnection. Manual wedge bonding machines such as those shown in U.S. Pat. Nos. 3,216,640 and 3,543,988 were capable of making a first and second wire bond and subsequently breaking the wire away from the last or second bond. Such manual machines were adapted to feed or move a portion or length of wire through a wire feed guide so that an unshaped length of wire was available for making the next first bond. Sometimes the extended tail or length of wire was performed or shaped by a mechanical device prior to making the next first bond and sometimes the skill of the individual operator was depended upon to inspect for the proper length of the tail and then to form the wire in the process of making the next first bond.

After the introduction of high speed automatic wedge bonding machines which make as many as 120 wire bonds a minute at programmed bonding points, it became impossible to inject operator inspection and responsive solution to assure that the length of tail under the working face of the bonding wedge as well as the shape of the tail was optimum and/or acceptable for making the next first bond.

The problems which effect the length and shape of a wire bonding tail in an automatic wedge bonder are too numerous to enumerate, however, several of the prior art problems which cause the majority of first bond failures will be discussed as a point of departure for the basis of the present novel method.

Something less than ideal tail length and tail position or shape was recognized in the prior art and required continuing adjustment of mechanisms to control tail length and position. Present attempts to make high density VLSI devices reduce the real estate or size of the bonding pads. As the real estate bonding pads size become smaller, smaller wire sizes are employed to make connections. Also, the bonding wedge and the working face of the bonding wedge are made smaller, enabling a bond on smaller bonding pads so that the position and length of the tail under the working face of a bonding wedge is now more critical than it has been in the prior art.

In one type of prior art manual bonding machine, the bonding wedge was held in pressure contact with the second bond when the wire was pulled by an articulating action of a wire clamp to break the wire at the second bond. This causes the free end of the wire in the bonding tool to be elongated beyond its elastic limit and also beyond the yield point at the point adjacent to the second bond which had been purposely deformed and weakened at a cross-sectional area adjacent the second bond. The portion of the wire which was elongated was work hardened, thus stresses were introduced into the wire which caused the wire to curl into an unpredictable shape and assume an unpredictable position.

The manual wedge bonding machine described in U.S. Pat. No. 3,216,640 did not maintain the bonding wedge on the second bond at the time the wire is severed. Instead, the bonding tool was moved first vertically and then horizontally. A remote wire clamp was actuated to place tension in the wire. The length of wire being stretched and the inconsistent angle of pull caused the tail under the bonding tool to be inconsistent.

When articulating wire clamps are employed to clamp the free end of the wire behind the bonding tool and pull the wire to break the wire at the second bond, the clamp may slip on the wire. This results in not pulling an exact length or distance of wire when the wire is broken. When the wire clamp is articulated forward to supply a new length of tail under the working face of the bonding tool, the tail is now too long which often causes an improper first bond even when shaped correctly.

When the articulating wire clamp slips relative to the wire when feeding a new length of wire tail under the working face of the bonding tool, the tail may be too short which results in an improper length of wire under the working face of the bonding tool. This can cause the bond to be squashed out by the predetermined bonding force acting on an insufficient area or can cause an improper bond which easily breaks. The above prior art problems have been recognized, however, it was not generally recognized that the prior art bonding wedge which was in contact with the second bond at the time the wire was pulled to break the wire at the second bond caused a scrubbing action between the bonding wedge and the second bond which noticeably affected the appearance of the second bond. As will be discussed in more detail hereinafter, it was discovered that a scrubbing action occurs at the time of breaking the wire adjacent the second bond which may result in a scrubbing action of the bonding tool on the second bond.

To some extent automatic wire bonders having digital control panels have permitted the operator to program the movement of the bonding tool relative to the bonding position on the semiconductor device more accurately which in turn permits the control of the length of the wire produced when the wire clamping mechanism is operating correctly. This ability to control the length of the bonding tail after the second bond has not solved the problem of inconsistent tail length, inconsistent tail position and shape.

SUMMARY OF THE INVENTION

It is a principal object of the present invention to provide a method which will enable the production of constant shape, constant position and length of fine wire tails under the working face of the bonding wedge in an automatic wire bonder.

It is another principal object of the present invention to provide a method for forming a constant length bonding tail under the working face of the bonding tool.

It is yet another object of the present invention to provide a method for breaking the wire at the second bond which does not disfigure the second bond.

It is yet another object of the present invention to break the wire at the second bond after the bonding tool has been disengaged from the second bond to prevent disfiguring the second bond.

It is yet another object of the present invention to provide a method of moving a bonding tool relative to a second bond position in a predetermined and novel intermittent path to ensure that the exposed tail under the bonding wedge is preformed in an exact shape and exact length in preparation for the next first bond.

According to these and other objects of the present invention to be discussed in greater detail hereinafter, there is provided a method for forming an exact predetermined shape and length of fine wire under the working face of the bonding wedge after making a second wire bond. After the second wire bond is made the bonding tool is raised relative to the second bond position while the wire clamp is open. The bonding wedge is then moved relative to the second bonding point to pay out an exact length of fine wire under the working face of the bonding wedge at which time all movement in the automatic wire bonder is ceased sufficiently long to damp out any vibration which may effect the length of the wire under the working face of the bonding wedge. At this time the wire clamp is actuated fixing the length of fine wire which extends under the working face of the bonding wedge and the bonding wedge is then moved substantially vertically away from the second bond on the semiconductor device while simultaneously the semiconductor device which is mounted on an X-Y table, is moved relatively horizontally away from the bonding wedge so that the fixed length of fine wire under the bonding wedge is broken at a previously weakened point adjacent the second bond and the fixed length of fine wire under the working face of the bonding tool is both work formed and positioned at a predetermined desired angle under the working face of the bonding tool.

BRIEF DESCRIPTION OF THE DRAWINGS

The foregoing objects and advantages of the novel method of making a optimum tail length under the working face of a bonding tool will be apparent from the detailed description of the accompanying drawings in which.

DESCRIPTION OF THE PREFERRED EMBODIMENT

Figure 1:
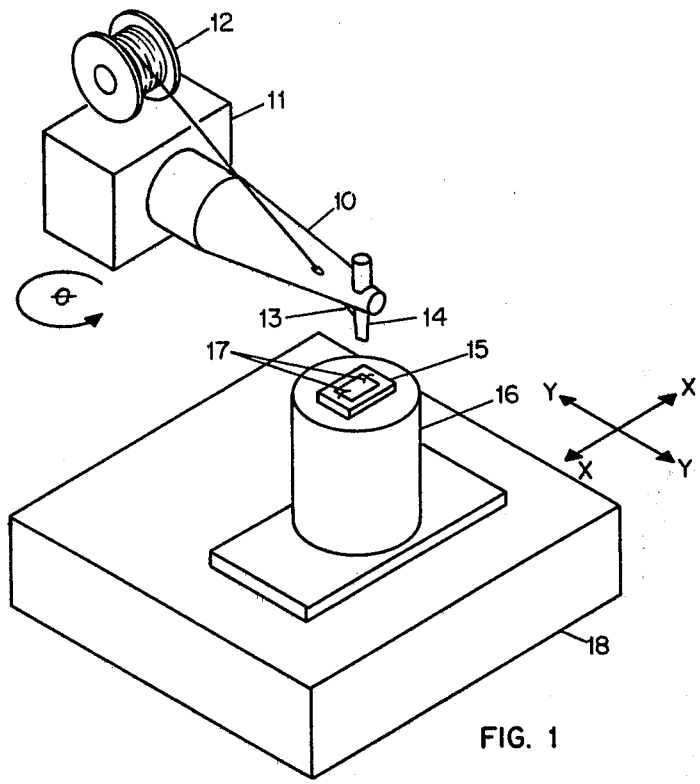
FIG. 1 is an isometric view in partial detail of a bonding tool holder and bonding tool positioned opposite the semiconductor device located on a workholder mounted on an X-Y table.

Refer now to FIG. 1 showing an ultrasonic transducer 10 which is mounted in an articulating mounting block 11 to provide vertical as well as circular or theta ($\theta$) movement of the bonding tool. A spool of fine wire 12 is adapted to supply a fine wire 13 to the bonding tool 14 for making first and second wire bond interconnections on semiconductor device 15 mounted on workholder 16 as is described in U.S. Pat. No. 3,543,988 etc. Two wire interconnections 17 are shown on semiconductor device 15, however, it will be understood that such wire interconnections may be made either on the semiconductor device or at the edge of the semiconductor device for lead out purposes. The workholder 16 is shown mounted on an X-Y table which is supported on an automatic wire bonding machine (not shown) and adapted to be moved in an X and Y direction. It will be understood that the bonding tool 14 will be rotated in a theta direction so that the movement from the first bond to the second bond position will maintain the fine wire 13 axially aligned under the working face of the bonding tool and in the groove (not shown).

Figure 2:
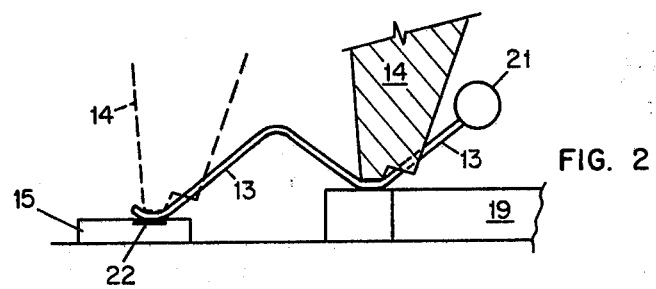
FIG. 2 is a schematic diagram in elevation showing the relative position of a wedge bonding tool at first and second bond positions.

Refer now to FIG. 2 showing in enlarged detail a bonding tool 14 at the second bond position engaging the wire 13 against the pad on leadout frame 19 to complete the second bond while the wire clamp 21 is closed. In phantom lines a bonding tool 14 is shown engaging the wire 13 against a bonding pad 22 on semiconductor device 15 to illustrate the ultrasonic bonding of the wire when making of a first bond at pad 22. It will be understood that after the second bond is made that the bonding tool 14 is raised vertically and that the X-Y table is moved to the left or in the X direction simultaneously and the clamp 21 is now open.

Figure 3:
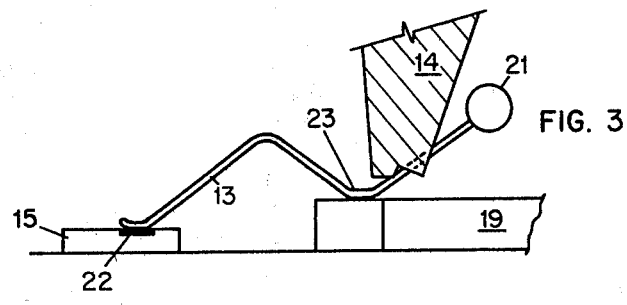
FIG. 3 is a schematic diagram in elevation showing the relative position of the bonding tool at the time the wire clamp is closed and the steps leading to making the bonding tail are initiated.

FIG. 3 shows the position of the bonding tool 14 after the X-Y table has moved to the left and after the bonding tool has moved substantially in a vertical direction and after the wire clamp 21 is open prior to closing the wire clamp 21 to affect a breaking of the wire 13 adjacent the second bond 23.

Figure 4:
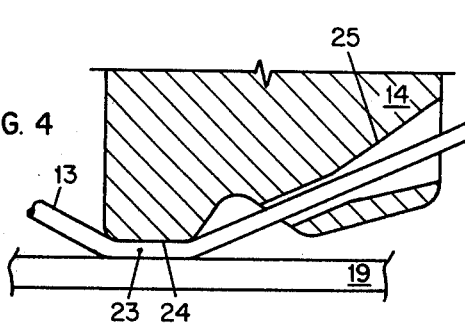
FIG. 4 is an enlarged schematic view in elevation showing the bonding tool at the completion of the second bond.

Refer now to FIG. 4 showing in greater detail the bonding tool 14 engaging with a predetermined force the fine wire 13 so that the working face 24 of the bonding tool deforms the wire to form a second bond 23. Preferably the wire clamp 21 is closed as noted schematically and the wire 13 is axially guided in the wire guide hole 25.

Figure 5:
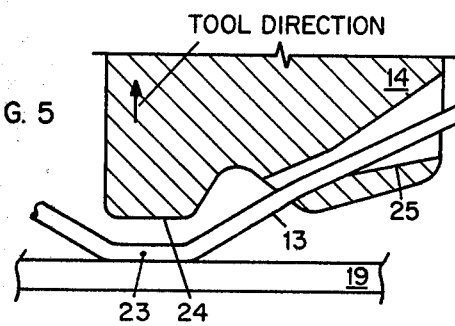
FIG. 5 is an enlarged schematic view of the bonding tool as it is initially moved relative to the second bond position.
Figure 6:
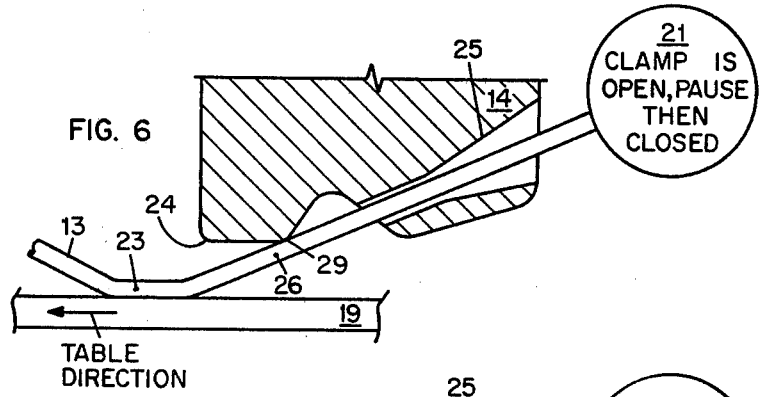
FIG. 6 is an enlarged schematic view of a bonding tool after the X-Y table has moved to its new position.

As shown in FIG. 5 after the bonding tool 14 has made the second bond 23 on the leadout 19, the working face 24 of the bonding tool is raised substantially vertically. The wire 13 may be deformed by the bottom of the wire guide hole 25. The wire clamp 21 is now open to permit wire 13 to be bent or formed. The leadout 19 on the lead frame (not shown) is initially maintained in its original position. As shown in FIG. 6 the leadout 19 on the lead frame (not shown) is moved by the X-Y table in a direction which maintains the predetermined length of wire which will become the wire tail 26 axially aligned under the working face 24 of the bonding tool 14. It will be noted that the wire 13 in the wire guide hole 25 may now assume its original axial shape. FIG. 6 is adapted to show the relative position of the wire tail 26 and the working face 24 of the bonding tool 14 after the bonding tool is moved to its desired position while the wire clamp 21 is open and all movement of the bonding tool 14 relative to the X-Y table 18 has ceased so that vibration and relative movement has stopped. At this point the wire clamp 21 is then closed.

Figure 7:
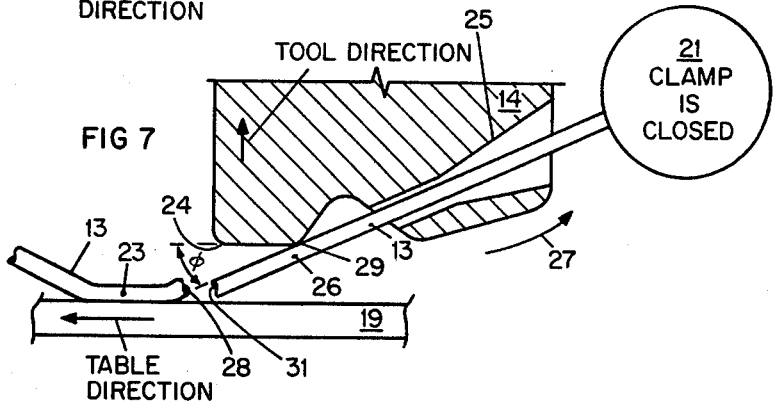
FIG. 7 is an enlarged schematic view of the bonding tool relative to the second bond shortly after the tail has been broken adjacent the second bond.

Refer now to FIG. 7 showing the position of the second bond 23 after it has been moved in the X direction by movement of the X-Y table 18 shortly after the breaking of the wire 13 has occurred adjacent the second bond 23. It will be noted that at the time the wire 13 breaks from the second bond it is in substantial contact with the leadout 19 on a lead frame (not shown) and that the wire tail 26 under the working face 24 of the bonding tool 14 has been forced to assume a predetermined angle $\theta$ relative to the working face 24. It will be noted that the tool movement is substantially vertical and that the table movement is substantially horizontal and the resulting direction at arrow 27 is arcuate or curved. Since the wire clamp 21 is closed and the bonding tool 14 is moved together with the clamp in a direction which is substantially axially aligned with the free end of the wire 13 extending from the wire clamp under the working face 24 the bonding tool 14 that little or no distortion of the wire 13 occurs. This is to say that even though wire 13 is elongated beyond its yield point the deformation of the wire is axially and the wire maintains its axial shape at the time the wire breaks at the second bond. The same physical shape occurs when a wire is placed in a testing machine and stretched beyond its yield point to cause the wire to break as it work hardens. The point 28 adjacent the second bond 23 where the wire 13 breaks is reduced in area by the back radius 29 of the working face 24 of the bonding tool 14. In order to maintain the angle $\phi$ at a predetermined angle between 30 and 45 degrees the wire 13 will engage the back radius 29. The frictional engagement of the wire 13 between the back radius 29 provides stability for holding the tail 26 in the desired position under the working face 24.

Figure 8:
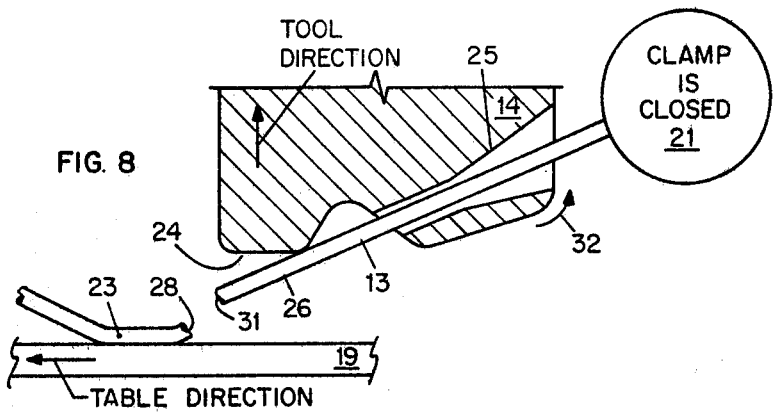
FIG. 8 is an enlarged schematic view of the bonding tool as it moves from second bond in preparation for making another first bond.

Refer now to FIGS. 7 and 8 showing the free end 31 of the wire 13 which forms the wire tail 26. In order to prevent the free end 31 from engaging the leadout 19 or the point 28 of the second bond 23 the X-Y table is moved in the X direction as shown in FIG. 7 and ceases its movement as shown in FIG. 8. It will be noted that the tool direction was substantially vertically and that the resultant direction shown by arrow 32 is now more vertical than horizontal. It will be noted that the wire clamp 21 is still maintained in the closed position and since the wire clamp has never moved relative to the wire 13 there is little chance for relative movement of the clamp 21 to the wire 13 unless the wire clamp is open. Stated differently, the wire clamp is not articulated and there is little chance for relative movement of the wire 13 to the clamp 21. The inclined tail 26 shown in FIGS. 7 and 8 will be bent against the working face 24 of bonding tool 14 when the next first bond is made.

Figure 9:
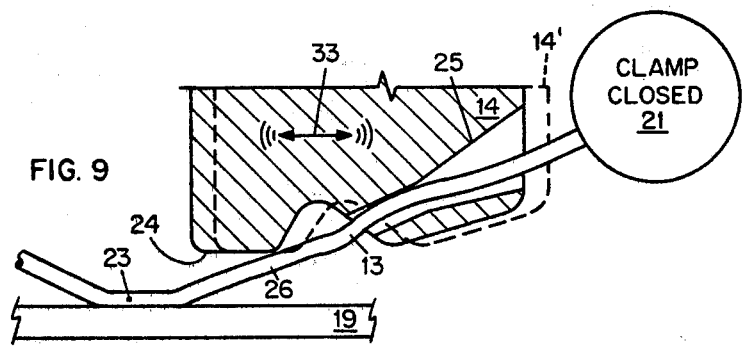
FIG. 9 is an enlarged schematic view of a bonding tool showing how the fine wire tail may be deformed before it is broken from the second bond.

It will be noted from the summary of FIGS. 4 to 8 that the elongation of wire 13 to effect breaking occurs after the bonding tool 14 has been raised from the second bond 23 so that the work hardening and elongation of the wire 13 reforms and straightens the wire including the tail 26. Refer now to FIG. 9 showing a bonding tool 14 in the solid lines and a bonding tool 14' superimposed thereon in phantom lines. Arrow 33 schematically represents the direction of relative vibrations of the workholder 16 and the bonding tool 14. If the clamp 21 is closed while the oscillations 33 are still occurring and before the wire 13 is severed from the second bond 23 the wire tail 26 will be deformed and stresses will be induced into the annealed wire 13. Not only is the wire tail 26 deflected out of its optimum shape so that it may spring out from under the working face 24 of bonding tool 14 but now the tail 26 may end up being longer than desired or shorter than desired depending on when the clamping took place.

Figure 10:
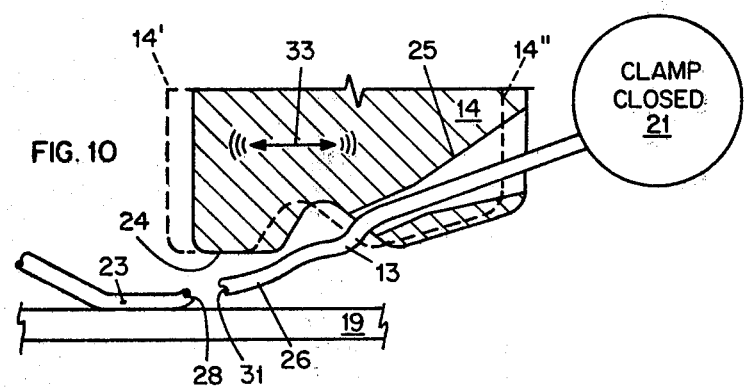
FIG. 10 is an enlarged schematic view of a bonding tool showing how the wire tail can be deformed after the tail is broken from the second bond.

FIG. 10 is an enlarged schematic view of the bonding tool 14 of FIG. 9 after the wire 13 has been broken from the second bond 23. In FIG. 10 if the wire tail 26 was too long the free end 31 could bump against point 28 of bond 23 and force the wire 13 to be deformed again even though it may have been straightened to some extent by the action of breaking the wire. It will be understood from the previous explanation of FIGS. 9 and 10 that the tail 26 could be shorter than desired if the clamp is closed when the relative position of the bonding tool is in the position of the phantom lines 14''. When the tail 26 is too short the area of wire 13 under the working face 24 of the bonding tool 14 is substantially reduced and the same force on the bonding tool 14 will increase the unit pressure on the wire 13 and cause the bond 23 to be substantially squashed.

Having explained the present invention using an illustration of an ultrasonic bonding tool 14 to clearly describe the operation of wedge bonding it will be understood that capillary bonding tools of the type employed in ball bonding also perform the same mode of wedge bonding operation at the second bond position. This is to say that the working face of a capillary bonding tool is shaped to enhance the breaking of the wire 13 at the heel of the second bond. Thus, the method set forth in the claims which follow are clearly applicable to capillary ball bonding as they are to ultrasonic wedge bonding. Further, having explained the preferred embodiment of the present invention employing a bonding tool 14 which is adapted to be moved in the vertical direction and in the theta direction in conjunction with a workholder 16, and an X-Y table 18 which is moved in a horizontal plane or X-Y direction, it will be understood that all of these motions can be programmed into the holder or support on which the transducer 10 is mounted. Further, these X, Y and Z motions could be imparted by an X-Y-Z table 18. Thus, it will be understood that combinations of X,Y and Z motion may be embodied into either the bonding tool holder or the X-Y table without departing from the scope of the claims which are appended hereto.

We claim:

1. The method of forming an exact predetermined shape and length of fine wire under the face of a bonding wedge after making a second wire bond with an automatic wedge bonding machine of the type having a bonding wedge and a non-articulating wire clamp comprising the steps of:

making a second wire bond at a second bonding point on a semiconductor device to connect the second of two bonding points with a length of fine wire, providing an open wire clamp adjacent the rear of said bonding wedge, raising said bonding wedge relative to said second bonding point substantially vertically a small predetermined distance to pay out wire below said bonding wedge without permanently deforming the wire, moving said bonding wedge laterally relative to said second bonding point to pay out an exact predetermined straight axial length of fine wire under the center of the working face of said bonding wedge without permanently deforming the wire, ceasing movement of said bonding wedge relative to said second bonding point long enough to stop movement of said bonding wedge and damp out harmful vibrations, closing said wire clamp on said fine wire to fix the length of fine wire extended under the face of said bonding wedge, moving said bonding wedge relative to said second bonding point in a predetermined inclined angle direction aligned with the axial direction of said fine wire which maintains said fixed length of straight fine wire under the face of said bonding wedge while simultaneously moving said bonding wedge substantially vertically relative to said second bonding point, thereby breaking said straight fine wire at a point adjacent said second wire bond, and leaving a predetermined length of said straight fine wire inclined under the working face of said bonding wedge which is formed at a predetermined angle between the working face of said bonding wedge.

2. The method as set forth in claim 1 which further includes the steps of: positioning said working face of said bonding wedge over a first bonding point on said semiconductor, making a first wire bond at said first bonding point in a conventional manner, and simultaneously bending said predetermined length of straight fine wire formed at said predetermined inclined angle against the face of said bonding wedge during the step of making said first bond.

3. The method as set forth in claim 2 which further includes the step of:

opening said wire clamp, positioning said working face of said bonding wedge over said second bonding point, and repeating the steps of claim 1 to provide a fine wire connection between said first and said second bonding points, and providing an exact predetermined inclined shape and length of fine wire under the working face of said bonding wedge in preparation for making another first bond.

4. The method as set forth in claim 1 which further includes the step of:

continuing to move said bonding wedge up and away relative to said second bonding point after breaking said fine wire to avoid bending said predetermined length of fine wire against said semiconductor device.

5. The method as set forth in claim 4 which further comprises the steps of:

ceasing the movement of said second bonding point on said semiconductor device, and continuing to move said bonding wedge away from said bonding point for a predetermined distance.

6. The method as set forth in claim 1 wherein said semiconductor device is moved in the X-Y plane only.

7. The method as set forth in claim 6 wherein said bonding wedge moves in a substantially vertical direction only.

8. The method as set forth in claim 1 wherein said step of leaving a predetermined length of straight fine wire inclined under the working face of said bonding wedge comprises forming said fine wire at a predetermined angle of thirty to forty-five degrees between the working face of said bonding tool.

* * * * *